United States Patent

Shangguan et al.

[11] Patent Number: 6,082,610
[45] Date of Patent: *Jul. 4, 2000

[54] METHOD OF FORMING INTERCONNECTIONS ON ELECTRONIC MODULES

[75] Inventors: Dongkai Shangguan, Novi; Mohan Paruchuri; Achyuta Achari, both of Canton, all of Mich.

[73] Assignee: Ford Motor Company, Dearborn, Mich.

[*] Notice: This patent issued on a continued prosecution application filed under 37 CFR 1.53(d), and is subject to the twenty year patent term provisions of 35 U.S.C. 154(a)(2).

[21] Appl. No.: 08/880,955

[22] Filed: Jun. 23, 1997

[51] Int. Cl.⁷ .............................. B23K 1/20; H01L 29/40; H01L 21/441
[52] U.S. Cl. ................... 228/180.22; 228/208; 257/778; 438/613
[58] Field of Search .............................. 228/180.22, 208; 257/737, 738, 778; 438/613

[56] References Cited

U.S. PATENT DOCUMENTS

| | | | |
|---|---|---|---|
| 3,658,660 | 4/1972 | Maddock | 204/4 |
| 3,925,110 | 12/1975 | Prematta et al. | 148/11.5 |
| 4,887,760 | 12/1989 | Toshino et al. | 228/56.3 |
| 4,970,571 | 11/1990 | Yamakawa et al. | 357/71 |
| 5,120,678 | 6/1992 | Moore et al. | 437/183 |
| 5,143,865 | 9/1992 | Hideshima et al. | 437/183 |
| 5,251,806 | 10/1993 | Agarwala et al. | 228/180.22 |
| 5,258,648 | 11/1993 | Lin | 257/778 |
| 5,277,756 | 1/1994 | Dion . | |
| 5,342,999 | 8/1994 | Frei et al. | 174/266 |
| 5,390,080 | 2/1995 | Melton et al. | 361/765 |
| 5,401,689 | 3/1995 | Frei et al. | 437/209 |
| 5,452,842 | 9/1995 | Melton et al. | 228/180.22 |
| 5,454,160 | 10/1995 | Nickel | 29/840 |
| 5,470,787 | 11/1995 | Greer | 437/183 |
| 5,476,211 | 12/1995 | Khandros | 228/180.5 |
| 5,491,036 | 2/1996 | Carey, II et al. | 428/647 |
| 5,542,174 | 8/1996 | Chiu | 29/840 |
| 5,611,481 | 3/1997 | Akamatsu et al. | 228/180.22 |
| 5,634,268 | 6/1997 | Dalal et al. | 29/840 |
| 5,698,160 | 12/1997 | Chen et al. | 420/557 |
| 5,729,896 | 3/1998 | Dalal et al. | 29/840 |
| 5,796,591 | 8/1998 | Dalal et al. | 361/779 |
| 5,808,360 | 9/1998 | Akram | 257/738 |
| 5,855,993 | 1/1999 | Brady et al. | 428/209 |
| 5,917,229 | 6/1999 | Nathan et al. | 257/529 |
| 6,011,313 | 1/2000 | Shangguan et al. | 257/778 |

FOREIGN PATENT DOCUMENTS

| | | |
|---|---|---|
| 0 262 580 A2 | 6/1988 | European Pat. Off. . |
| 0 308 971 A2 | 3/1989 | European Pat. Off. . |
| 0 568 995 A2 | 10/1993 | European Pat. Off. . |

OTHER PUBLICATIONS

Burkhard, D.J., "Copper Wirebond Barrier Metallization," Motorola Technical Developments, vol. 14, Dec. 1, 1991, p. 124.

Patent Abstracts of Japan, vol. 012, No. 369 (E–665), Oct. 4, 1988 & JP 63 122155 A (Matsushita Electric Ind Co Ltd), May 26, 1988.

Metals Handbook, vol. 8, 8th ed. ASM, pp. 270, 312, and 336, 1973.

*Primary Examiner*—Patrick Ryan
*Assistant Examiner*—Kiley Stoner
*Attorney, Agent, or Firm*—Joseph W. Malleck; Roger L. May

[57] ABSTRACT

A method which utilizes flip chip technology to provide interconnection between printed circuit boards and integrated circuits is disclosed. The method involves metallization of the bond pad and multiple, novel bump compositions and coating compositions to provide an interconnection which is reliable and which withstands differences in the coefficient of thermal expansion between the silicon device and the bump material.

12 Claims, 1 Drawing Sheet

METHOD OF FORMING INTERCONNECTIONS ON ELECTRONIC MODULES

FIELD OF THE INVENTION

The present invention relates to a method of forming an interconnection on printed circuit board electronic modules. The interconnection of this invention involves a flip chip that is designed to be reliable for use in conjunction with printed circuit boards.

BACKGROUND ART

With continuing advances in the semiconductor industry, electrical circuits are often designed to utilize as little space as is practicable. Circuit space often is a valuable asset which needs to be conserved, and a miniaturization of electrical circuits often improves speed, reduces noise and leads to other performance advantages. In combination with the need to conserve circuit space, circuit interconnections should be designed to function reliably under the expected operating condition.

Vias are often utilized with integrated circuits (IC) to provide the interconnection necessary between the internal circuitry of the IC and the external interface, for example circuitry printed wiring board electronic modules. This interconnection can be achieved in two ways. With the first approach, the vias are finished with metal pads which are wirebonded to lead frames. The back or inactive side of the semiconductor device is metallized so that the device can be soldered to a heat-spreader for heat dissipation, if needed. The complete device is then molded in a plastics package. The lead frames, which extend from inside of the plastics package to the outside of the package, are to be soldered to the printed wiring board (PWB) during assembly. However, the wire-bonding method is a major contributor to signal parasitic inductance, especially if the wire loop length is not strictly minimized. Such parasitic inductance distorts signal frequencies.

The second approach, commonly referred to as "flip chip", is to have a suitable layered metallization, using conventional metal deposition processes for the via bond pad, upon which a metal bump is constructed, and the device can be bonded directly to the substrate through the bump. Flip chip or direct chip attachment mounting techniques are used to increase the density of electrical circuits. Flip chip mounting techniques relate to "flipping" the die over and directly attaching the active or top surface of the semiconductor device to a printed wiring board. Since the actual semiconductor die size is so much smaller than a typical semiconductor package, there is significant savings with integrated circuit space and substrate space. This method saves substantial packaging costs, integrated circuit space and substrate space.

Flip chip technology uses electrically conducted bumps such as tin-lead solder or gold, to provide input/output interconnects between the circuit on the silicon chip and the circuitry on the substrate of an electronic module. The basic connection scheme consists of die input/output (I/O) pads that have had bumps applied, plus a matching set of substrate solder wettable pads. The die I/O pads are formed by etching vias through the passivation layer followed by hermetically sealing the via by evaporating layers of the appropriate materials through a mask. A solder alloy is then deposited on the pad to form the solder bump. Meanwhile, the substrate solder wettable pads are formed to interconnect with the bumps on the integrated circuit, for example through reflow. A flux is used to remove oxides on metal surfaces in order to promote sound metallurgical bonding. The reflow step can be achieved in a vapor-phase or infrared oven or by a localized heat source. The use of flip chips on printed wiring boards (PWB) is desirable due to its simplicity, low cost, high density and reliability.

However, conventional flip chip techniques have several disadvantages. One significant problem is that direct attachment of a device to a printed wiring board provides little opportunity for relative movement between the device and the printed wiring board. Traditional printed wiring boards are made using a substrate, such as a glass fiber reinforced epoxy or a polyamide, which has a vastly different coefficient of thermal expansion than the silicon from which most semiconductor devices are made. Consequently, when the electrical circuit experiences temperature changes, the printed wiring board expands at a different rate than the semiconductor device. As a result of the stresses experienced from the differing coefficient of thermal expansion, a solder joint may break, causing failure of the electronic product.

Yet another problem associated with conventional flip chip techniques is that of metallurgical incompatibilities between semiconductor devices and printed wiring boards. Semiconductor devices typically incorporate aluminum bonding pads, which are easier to deposit and are suitable for metal bonding purposes. However, the aluminum pads are not solderable with the tin-lead solders. Consequently, flip chip techniques first ensure that pad geometries of a semiconductor device are compatible with the printed wiring board, then deposit a barrier metal over the pads, followed by a copper layer over the barrier metal. The barrier metal protects the aluminum device pad from the copper. Bumps are formed over the copper layer for interconnection with the printed wiring board. Conventional flip chips use tin-lead solders to form the bumps. However, with solder bumps, there needs to be certain distances between the bumps in order to avoid bridging between the bumps during reflow soldering, therefore limiting the input/output density or "pitch" of the device. In order to satisfy the need for high density electronic packaging, gold bumps have been used for interconnection to tin over the copper pad on the PWB through thermocompression bonding. However, gold is very expensive and therefore limits the wide application of such products. Accordingly, there is a need for a reliable flip chip bump interconnect which takes care of the problems associated with changing temperature conditions, is capable of providing high density fine pitch interconnection, and is affordable.

SUMMARY OF THE INVENTION

Accordingly, it is an object of the present invention to provide a method for adapting semiconductor devices for interconnection with a printed wiring board. Yet another object of the present invention is to provide a method of interconnecting a semiconductor device and a printed wiring board to resolve any problems associated with coefficient of thermal expansion mismatches.

Still another object of the invention is to provide a method for interconnecting a semiconductor device and a printed wiring board which is inexpensive, consumes a minimal amount of space, and does not require the use of wire bonding.

The above and other advantages of the present invention are carried out by the present invention which describes a method of forming an interconnection between a printed wiring board and an integrated circuit. The invention further includes a method of forming a metallized via bond pad on an integrated circuit for flip chip interconnection.

BEST MODE FOR CARRYING OUT THE INVENTION

The purpose of this invention is to provide materials and a method for forming a flip chip interconnect at a low cost and that is robust for use in connection with printed wiring board electronic modules, for example for use in connection with automotive electronics.

The new features of this invention involve 1) via bond pad metallization, and 2) metallurgy of the bump and the coating on the substrate pad, as well as the process and mechanism of bond formation. Under this invention, the via bond pad metallization, and the bump metal systems, can be used separately or in combination. In other words, the via bond pad metallization described here can be used with other bump metal systems, likewise, the bump metal systems described here can be used with other via bond pad metallization as well.

Figure 1:
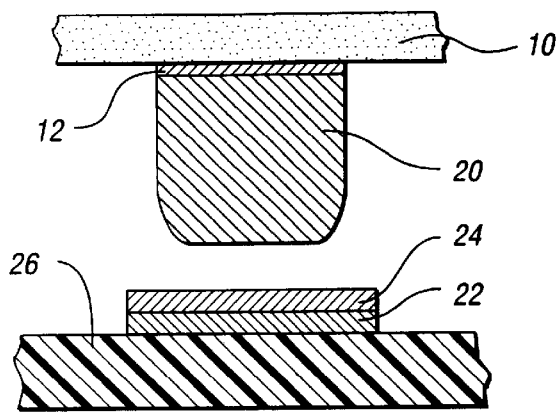
FIG. 1 illustrated the flip chip bump used to obtain an interconnection with printed wiring board substrates.
Figure 2:
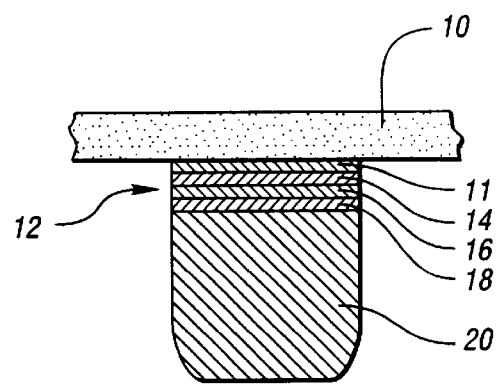
FIG. 2 illustrates the layering structure of the metallized via bond pad.

As illustrated in FIGS. 1 and 2, the metallization of the via bond pad 12 on the integrated circuit's silicon chip 10, comprises a diffusion barrier layer 14, preferably sputtered titanium tungsten (Ti—W), having a preferred thickness of 8–12 KA° over a primary metallization layer, preferably aluminum or a combination such as Al/2% Cu or Al/1% Si/0.5% Cu, preferably having a thickness of 10–20 KA°, which is placed in mating contact with the silicon chip 10. The titanium tungsten layer serves as the diffusion barrier and adheres well to the underlying aluminum layer. The titanium tungsten layer is then covered with an oxidation protection layer, preferably sputtered copper 16 having a thickness of about 10 KA°; this layer provides oxidation protection for the titanium tungsten layer during the subsequent electroplating process and also provides adhesion for the "stud".

The next step involves the application of a main metallization layer, preferably a copper, silver or nickel stud having a preferred thickness of 25–45 $\mu$m, which is electroplated over the sputtered copper layer 16, and which provides the main metallization of the bump 20. As a result, the via bond pad 12 metallization is formed upon which the flip chip bump 20 will then be created.

Figure 3:
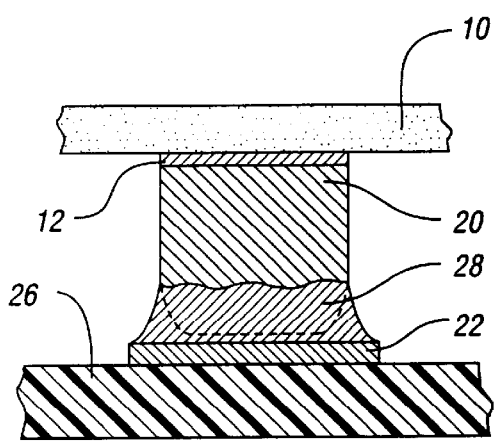
FIG. 3 illustrates the formation of the eutectic phase interconnecting the printed wiring board substrate and the flip chip bump.
Figure 4:
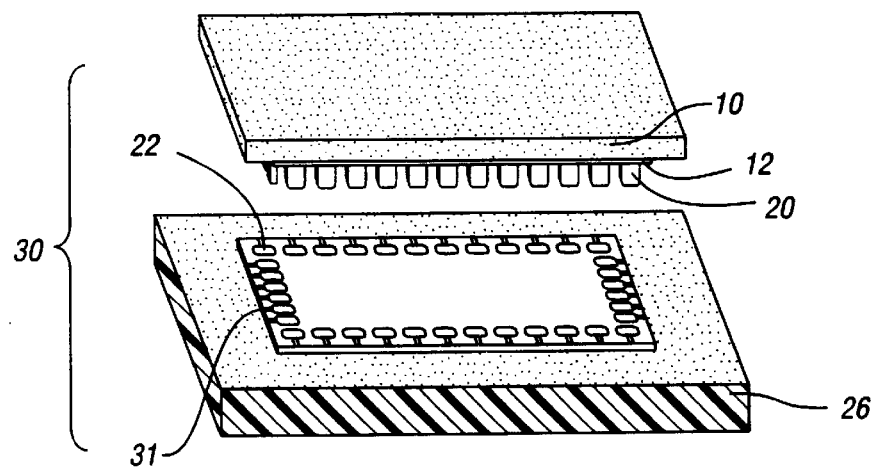
FIG. 4 illustrates an exploded perspective view of an integrated circuit having a plurality of flip chip bumps and the interconnection to the printed wiring board substrate.

As illustrated in FIGS. 1, 2 and 3, the flip chip interconnection method of this invention involves using a first metal for the bump 20 and a second metal on the substrate pad 22 interconnecting the conductor traces on the PWB 26 and forming a sound metallurgical bond between the first metal and the second metal through the formation of a eutectic phase through the interfacial region 28. This bump 20 is formed with the first metal through well-established bump forming processes such as electroplating. The second metal is applied as a coating 24, again using well-established methods such as plating, on the pad 22 interconnecting the conductor traces on the printed wiring board substrate 26.

In the preferred embodiment, zinc is utilized as the first metal and tin is utilized as the second metal. Also in the preferred embodiment, the height of the bump 20, when composed of zinc, is preferably between 25–75 $\mu$m, depending on the specific application. A gold layer, having a preferred thickness of 5–20 $\mu$in or 0.13–0.51 $\mu$m, can be applied, preferably by plating, over the zinc bump 20 for oxidation protection prior to interconnect formation. In the preferred embodiment, the coating 24 on the substrate pad 22 of the PWB substrate 26 consists of a tin layer, most preferably a matte tin, having a preferred thickness between 300 to 400 $\mu$in (i.e. 7.62–10.16 $\mu$m), which is placed over a copper substrate pad 22 interconnecting the conductor traces 31. An optional nickel layer with a preferred thickness of 90–300 $\mu$in (i.e. 2.29–7.62 $\mu$m) may be used as a barrier layer between the copper and the tin layers to prevent copper diffusion through the tin layer. The nickel layer may be utilized depending on the operating conditions of the module. An additional optional layer, an oxidation prevention layer, preferably a gold flash, having a preferred thickness of 5–20 $\mu$in (i.e. 0.13–0.51 $\mu$m) may be used to prevent oxidation of the nickel and/or tin layers prior to interconnect formation.

For the formation of the interconnect between the bump 20 and the pad 22, the bump 20 is brought into contact with the coating 24 on the pad 22 for a direct chip bonding. In the preferred embodiment, an energy source will be provided to bring the temperature for the contact area to 240–290° C. The heating method can be, among others, reflow or thermal compression which is the preferred method for this invention. In the thermal compression method, 5–15 seconds under 0–250 g pressure will be used as the key process parameters.

When the temperature is raised to its preferred range, 240–290° C., which is above the melting temperature of the second metal, tin, and below the melting temperature of the first metal, zinc, the second metal, tin, melts at 232° C. and the eutectic phase 26 is formed between tin and zinc, the eutectic temperature being 199° C. This eutectic phase 26 will provide strong bonding between the bump and the substrate. The melting temperatures of the zinc and tin—zinc eutectic make the interconnect suitable for automotive and other electronic applications.

The bulk of the zinc bump 20 will not melt during the process, the melting temperature of zinc being 420° C., which thus maintains the stand-off height of the bump and prevents bridging of the bumps. Accordingly, the bump will not collapse, a problem which plagues conventional "controlled collapsed chip connections". A large stand-off height increases the fatigue life of the bump interconnect. Note that the fatigue life of the bump is inversely proportional to the shear strain in the bump, which in turn is inversely proportional to the stand-off height of the bump after interconnect formation.

During the process, gold on the bottom surface of the zinc bump, being a very small constituent, will be dissolved into the eutectic phase. Gold on the sides of the zinc bump will remain and continue to provide corrosion protection for the bump during the service of the module.

The thermal conductivity of zinc is 116 W/(mk), and the electrical resistivity of zinc is $5.9 \times 10^{-8}$ $\Omega$m. These properties also satisfy the functional requirements of the bump for electrical connection and thermal dissipation.

As compared to the alternative gold bump, the present invention's zinc flip chip bump provides equivalent functionality and reliability, at a significant cost savings. For example, under the American Metal Market as of March of 1995, the price of gold was $381.40 per troy ounce, while the price of zinc was 0.47 per pound, the price difference being greater than 11,800 times.

In an alternate embodiment, zinc is utilized as the first metal and indium as the second metal. The melting temperatures of zinc and indium are respectively 420° C. and 157° C., and indium/zinc eutectic temperature is 144° C. Pursuant to the above-identified process, the preferred process temperature should be in the range of 170–190° C. Other process and dimensional parameters are similar to the first embodiment of this invention.

In a third embodiment of this invention, tin can be utilized as the first metal and indium as the second. The melting temperatures of indium and tin are 157° C. and 232° C., respectively, and the indium/tin eutectic temperature is 120° C. In the preferred embodiment, the process temperature would be in the range of 170° C.–190° C. Again, other process and dimensional parameters are similar to the first embodiment. Notably, the thermal conductivity of tin is 66.6 W/(mk), and its electrical resistivity is $11.5 \times 10^{-8}$ Ωm. Accordingly, this third embodiment is also particularly suitable for the intended application.

In yet a fourth embodiment, bismuth can be utilized as the first metal and tin as the second metal. The melting temperatures of bismuth and tin are 271° C. and 232° C., respectively, and the bismuth/tin eutectic temperature is 139° C. In the preferred embodiment, the appropriate process temperature should be in the range of 245° C.–265° C. Again, the process and dimensional parameters as provided in the first embodiment are applicable with this fourth embodiment. The thermal conductivity of bismuth is 7.87 W/(mk) and its electrical resistivity is $107 \times 10^{-8}$ Ωm.

In application, the method for a bump interconnection formation as provided in this method, is particularly useful, as the method does not involve toxic constituents, nor does the process present any environmental concerns. Moreover, the process is fluxless since no fluxing is needed for interconnect formation. This provides a significant benefit, in that it is known that flux residues are corrosive and are detrimental to the performance of circuitry.

To further enhance the reliability of the bump interconnects, an epoxy underfill can be used for the flip chip on the electronic module. As such, during service of the electronic module, the mechanical load on the flip chip bumps will be greatly reduced. As a result, the interconnect is very reliable for the useful life of the product. The underfill will also provide additional corrosion protection for the bump.

This method is particularly suited for use in connection with automotive, consumer, military and other electronic packaging applications.

While the best mode and viable alternate embodiments for carrying out the invention have been described in detail as shown on the drawings, those familiar in the art to which this invention relates will recognize various alternative designs and embodiments for practicing the invention as defined by the following claims.

What is claimed is:

1. A method of forming an interconnection between a printed wiring board and an integrated circuit for automotive applications, comprising:

forming a via bond pad on the integrated circuit;

forming a flip chip bump with a first metal on said via bond pad wherein said first metal is zinc;

providing a substrate pad on the printed wiring board;

applying a coating of a second metal on said substrate pad wherein said second metal is tin; and forming an interconnection between said first metal and said second metal to bond the printed wiring board and the integrated circuit wherein said interconnection is lead-free and has a eutectic temperature above 170° C.

2. The method of claim 1, wherein said first metal is zinc and said second metal is tin.

3. The method of claim 2, wherein said zinc has a thickness between 25 and 75 μm.

4. The method of claim 2, wherein said tin coating has a thickness between 7.62 and 10.16 μm.

5. The method of claim 2, wherein said step of forming an interconnection comprises forming a eutectic phase between said first and second metal by heating to obtain a temperature in the range of 240° C. and 290° C.

6. The method of claim 1, wherein a barrier layer is sandwiched between said substrate pad and said second metal to prevent diffusion therebetween.

7. The method of claim 6, said barrier layer comprising nickel with a thickness in the range of 2.29–7.62 μm.

8. The method of claim 1, wherein an oxidation prevention layer is placed in contact with said second metal layer to prevent oxidation.

9. The method of claim 8, wherein said oxidation prevention layer comprises gold having a thickness between 0.13 and 0.51 μm.

10. The method of claim 1, wherein said substrate pad comprises copper.

11. The method of claim 1, wherein a gold coating is applied to said flip chip bump for oxidation protection.

12. The method of claim 1, wherein an epoxy underfill is used on said flip chip bump.

* * * * *